United States Patent
Pk et al.

(10) Patent No.: US 11,768,247 B2
(45) Date of Patent: Sep. 26, 2023

(54) METHOD AND APPARATUS FOR IMPROPER POWER SUPPLY DETECTION

(71) Applicant: SLING MEDIA PVT LTD, Bangaluru (IN)

(72) Inventors: Arun Pk, Karnataka (IN); Mansoor Ahmed, Karnataka (IN); Yashwanth Melwanki, Karnataka (IN); Amit Kumar, Karnataka (IN)

(73) Assignee: DISH Network Technologies India Private Limited

(*) Notice: Subject to any disclaimer, the term of this patent is extended or adjusted under 35 U.S.C. 154(b) by 456 days.

(21) Appl. No.: 16/686,386

(22) Filed: Nov. 18, 2019

(65) Prior Publication Data
US 2021/0148984 A1 May 20, 2021

(51) Int. Cl.
| | |
|---|---|
| G01R 31/38 | (2006.01) |
| G01R 31/3842 | (2019.01) |
| H02J 7/00 | (2006.01) |
| H01M 10/0525 | (2010.01) |
| G01R 31/36 | (2020.01) |
| H01M 10/42 | (2006.01) |

(52) U.S. Cl.
CPC ..... *G01R 31/3842* (2019.01); *G01R 31/3648* (2013.01); *H01M 10/0525* (2013.01); *H01M 10/42* (2013.01); *H02J 7/0068* (2013.01); *H02J 7/00714* (2020.01)

(58) Field of Classification Search
CPC ........... G01R 31/3842; G01R 31/3648; H01M 10/0525; H01M 10/42; H01M 10/44; H01M 2220/30; H02J 7/0021; H02J 7/0068; H02J 7/0036; H02J 7/00714; Y02E 60/10
See application file for complete search history.

(56) References Cited

U.S. PATENT DOCUMENTS

| | | | |
|---|---|---|---|
| 2009/0024858 A1* | 1/2009 | Hijazi | G06F 1/30 713/323 |
| 2014/0285022 A1* | 9/2014 | Dao | H02J 9/061 307/66 |
| 2014/0354240 A1* | 12/2014 | Wang | B60L 3/0046 320/136 |
| 2015/0123782 A1* | 5/2015 | Zwirn | G08B 29/12 |
| 2016/0187429 A1* | 6/2016 | Kawai | G01R 31/3651 |
| 2016/0241027 A1* | 8/2016 | Lei | H02J 1/00 |
| 2017/0059660 A1* | 3/2017 | Morsillo | G01R 31/3606 |
| 2020/0297325 A1* | 9/2020 | Kazui | A61B 8/56 |

* cited by examiner

*Primary Examiner* — Catherine T. Rastovski
*Assistant Examiner* — Lal C Mang
(74) *Attorney, Agent, or Firm* — KW Law, LLP

(57) ABSTRACT

Systems and processes are provided to detect an improper external power supply including a battery having a battery current output, a power supply for receiving an external voltage and an external current from an external power supply and for generating a control signal in response to receiving the external voltage, a processor operative to determine a first polarity of the battery current output at a first time in response to the control signal, to generate an error indicator in response to the first polarity being indicative of a discharging battery, and a display operative to display a user warning indicative of an improper external power supply in response to the error indicator.

20 Claims, 5 Drawing Sheets

METHOD AND APPARATUS FOR IMPROPER POWER SUPPLY DETECTION

TECHNICAL FIELD

The following discussion generally relates to the powering and charging of batteries and electronic devices. More particularly, the following discussion relates to determining a usability of a power supply in a rechargeable electronic device in light of current flow to the battery.

BACKGROUND

In recent years, portable electronic devices have become more and more ubiquitous. Portable electronic devices such as mobile phones, digital cameras, portable video games and other electronic entertainment devices are often powered by rechargeable batteries. Lithium Ion batteries are a type of rechargeable battery common in portable electronic devices, portable tools, and electric vehicles. Lithium ion batteries use an intercalated lithium compound as one electrode material and have a high energy density, no memory effect and low self-discharge. These batteries typically have a cutoff voltage at which the battery stops supplying voltage to the electronic device and is the voltage at which the battery is considered fully discharged. This cutoff voltage is operative to prevent damage to the electronic device and to the battery.

When operating a rechargeable device using a power supply that supplies an insufficient power level to the device, additional power may be drained from the battery during operation. At some point, the battery may discharge to a level below the cutoff voltage which results in the battery ceasing to supply power to the device, the power supply supplying an insufficient level of power and the device either shutting down or operating in a faulty manner. It is therefore desirable to create systems and methods that are able to determine if a power supply is providing an insufficient power level to a rechargeable device to prevent discharge of the battery and/or faulty operation of the rechargeable device. Other desirable features and characteristics will become apparent from the subsequent detailed description and the appended claims, taken in conjunction with the accompanying drawings and this background section.

BRIEF SUMMARY

Disclosed herein are human machine interface methods and systems and related circuitry for provisioning computational systems, methods for making and methods for operating such systems, and system equipped with onboard control systems. By way of example, and not limitation, presented are various embodiments of detection of power supply power levels and battery discharge states are disclosed herein.

In accordance with an aspect of the disclosure a method including initiating a processor operative to perform a function within a battery-operated device, receiving an indication of a connection of an external power supply, determining a first output current of a battery, generating an error indicator in response to the first output current of the battery being indicative of a discharging battery, and displaying a user prompt indicative of an improper power supply in response to the error indicator.

In accordance with another aspect of the disclosure where the first output current of the battery has a negative value indicative of the discharging battery.

In accordance with another aspect of the disclosure wherein the external power supply is operative to provide an insufficient power level to the battery-operated device.

In accordance with another aspect of the disclosure further including determining a second output current of the battery and wherein the second output current is indicative of a charging battery, generating a faulty power supply indicator in response to the first output current and the second output current, and displaying a faulty power supply warning in response to the faulty power supply indicator.

In accordance with another aspect of the disclosure wherein the processor is further operative to perform a standby function within the battery-operated device in response to the error indicator.

In accordance with another aspect of the disclosure wherein the user prompt is displayed via a light emitting diode.

In accordance with another aspect of the disclosure wherein the battery is a lithium ion battery.

In accordance with another aspect of the disclosure further including shutting down the battery-operated device in response to the error indicator.

In accordance with another aspect of the disclosure a battery-operated device including a battery having a battery current output, a power supply for receiving an external voltage and an external current from an external power supply and for generating a control signal in response to receiving the external voltage, a processor operative to determine a first polarity of the battery current output at a first time in response to the control signal, to generate an error indicator in response to the first polarity being indicative of a discharging battery, and a display operative to display a user warning indicative of an improper external power supply in response to the error indicator.

In accordance with another aspect of the disclosure wherein the error indicator is generated in response to an average battery current output determined in response to the first polarity and a second polarity at a second time being indicative of a discharging battery.

In accordance with another aspect of the disclosure including a user interface for providing an audible alert in response to the error indicator.

In accordance with another aspect of the disclosure wherein the battery is a lithium ion battery.

In accordance with another aspect of the disclosure wherein the user warning is a signal for illuminating a light emitting diode.

In accordance with another aspect of the disclosure wherein the processor is further operative to determine a second polarity at a second time and to generate a faulty power supply indicator in response to the first polarity being opposite of the second polarity, the display being further operative to display a faulty power supply user warning in response to the faulty power supply indicator.

In accordance with another aspect of the disclosure wherein the first polarity is a negative polarity indicative of the battery supplying a power to the battery-operated device.

In accordance with another aspect of the disclosure wherein the processor is further operative to enter a standby mode in response to the first polarity of the battery current output and the control signal.

In accordance with another aspect of the disclosure wherein the processor is further operative to enter a shutdown mode in response to the first polarity of the battery current output and the control signal.

In accordance with another aspect of the disclosure wherein the first polarity is determined in response to an average current register or a battery fuel gauge device In accordance with another aspect of the disclosure, an apparatus for an improper external power supply in a rechargeable battery equipped device including a sensor operative to detect a connection of an external power supply and to generate a control signal in response to detecting the connection of the external power supply, a battery having a battery output current, a battery charging circuit operative for charging the battery in response to a power received from the external power supply, a processor to receive the control signal, to detect an average current polarity of the battery in response to the control signal, and to generate an error signal in response to the average current polarity being negative indicative of a discharging battery, and a user interface for displaying an improper power supply warning in response to the error signal.

In accordance with another aspect of the disclosure wherein the processor is further operative to engage a standby mode for the rechargeable battery equipped device in response to the average current polarity being negative indicative of a discharging battery.

The above advantage and other advantages and features of the present disclosure will be apparent from the following detailed description of the preferred embodiments when taken in connection with the accompanying drawings.

BRIEF DESCRIPTION OF THE DRAWING FIGURES

The exemplary embodiments will hereinafter be described in conjunction with the following drawing figures, wherein like numerals denote like elements, and wherein.

The exemplifications set out herein illustrate preferred embodiments of the disclosure, and such exemplifications are not to be construed as limiting the scope of the disclosure in any manner.

DETAILED DESCRIPTION

The following detailed description is intended to provide various examples, but it is not intended to limit the disclosure or the application and uses of the disclosure. Furthermore, there is no intention to be bound by any theory presented in the preceding background or the following detailed description.

The general concepts described herein may be implemented in any rechargeable electronic device. For convenience of illustration, the following discussion often refers to a wireless video transmission device operative to receive video from a video producing device, such as a digital camera via a video cable, such as an HDMI cable and to convert a format of the video and to transmit the video via a wireless network. The actions taken in response to the detection of an improper power supply detection can be associated with the functionality of the mobile phones, portable electronic entertainment devices, and any other rechargeable electronic device. Additional details and examples are provided in the following description.

Figure 1:
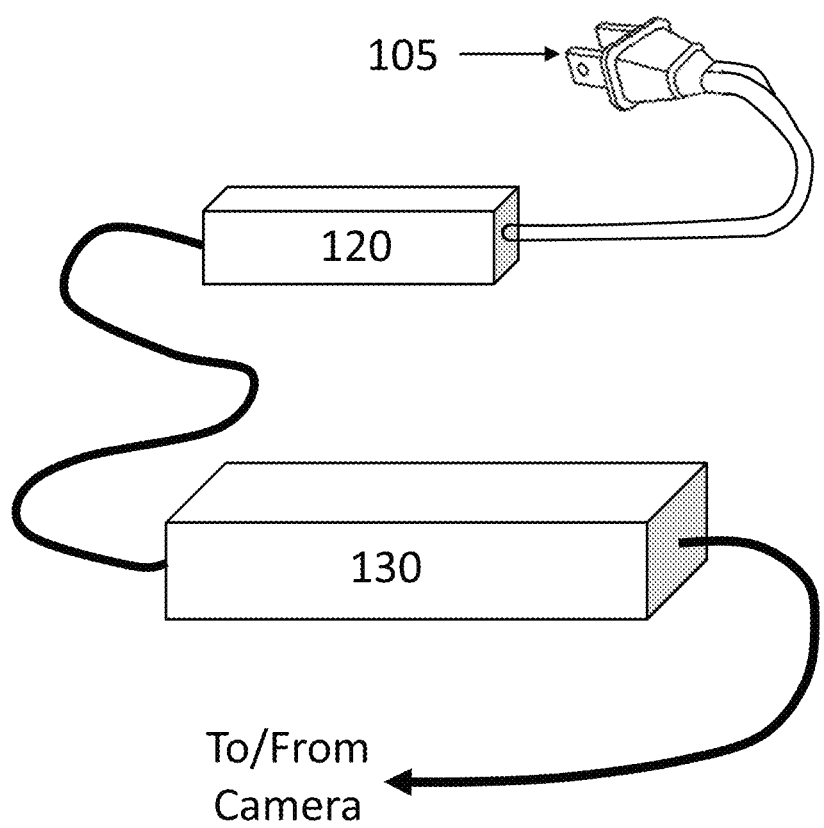
FIG. 1 shows an application 100 for detection of an improper power supply detection in an electronic device according to an exemplary embodiment of the present disclosure.

Turning now to FIG. 1, an environment for a system 100 for detection of an improper power supply in an electronic device according to an exemplary embodiment of the present disclosure is shown. The exemplary system 100 may include a device 130 with an integral rechargeable battery and charging circuitry, a power supply 120 with a connected standard 120-volt wall plug 105. The power supply 120 may also be supplied with a 240-volt supply or a combination thereof.

In this exemplary embodiment, the device 130 is operative to receive data from a camera and to convert this data to a format suitable for transmission via a wireless network, such as a Wi-Fi network. The exemplary device 130 includes a Lithium Ion battery which is charged when connected to the power supply 120. The power supply 120 may further be operative to power the device 130 while the power supply 120 is connected and the battery is being charged. The Lithium Ion battery is operative to power the device 130 when the power supply 120 is disconnected from the device 130 facilitating continued video streaming from the camera in a portable manner.

In this exemplary embodiment, a suitable power supply 120 may supply 2.0 amps of current at 5.0 volts using a standard micro universal serial bus (USB) cable. Under normal operation, 1.2 amps of current would be used to power the device 130 and 0.8 amps could be used to recharge the internal rechargeable battery. However, if a 1.0 amp power supply is used, the device 130 will still require the 1.2 amps to operate, and therefore the internal battery may supply the additional 0.2 amps to power the device 130. In this example, after a period of time, the battery will discharge to the cutoff voltage and subsequently cut off the output current of the battery dropping the total current to 1.0 amps. In response to the current dropping below the required 1.2 amps, the device may shutdown or may continue to operate in a faulty manner. With the power supply 120 still connected to the device 130 and the device 130 being powered down or operating faulty without any additional warning indicators, the user may assume that there is a problem with the device 130.

In order to detect an improper power supply, the exemplary system is operative to monitor the output current of the internal rechargeable battery. If the battery has a negative current, meaning that it is discharging, the system may assume that the power supply 120 is supplying an insufficient power level and an indication is provided to a user interface indicative of the incorrect power supply. In one example, the device 130 may continue to operate with the incorrect power supply indicator activated where the battery suppling a portion of the operating power. In an alternatively example, the device 130 may go into a low power or standby state with the incorrect power supply indicator activated. The incorrect power supply indicator is intended to notify a user that an incorrect power supply has been connected to the device 130 and that the power supply 130 should be replaced with a proper power supply. In this example, a proper power supply would be a 2-amp power supply.

The system may further be operative to identify a faulty USB cable in response to monitoring the battery current. If the battery current rapidly changes from a negative current to a positive current over a short time period, such as five changes in current polarity in 3 seconds, the system may assume that an intermittent cable is being used and generate a user warning indicative of a possible faulty cable in response. In an exemplary embodiment, an average current register may be used to detect the battery discharging status. If the USB power is connected & the battery current is discharging, then the power supply 130 is considered as a faulty power supply once the average current is negative for a predetermined duration of time.

Figure 2:
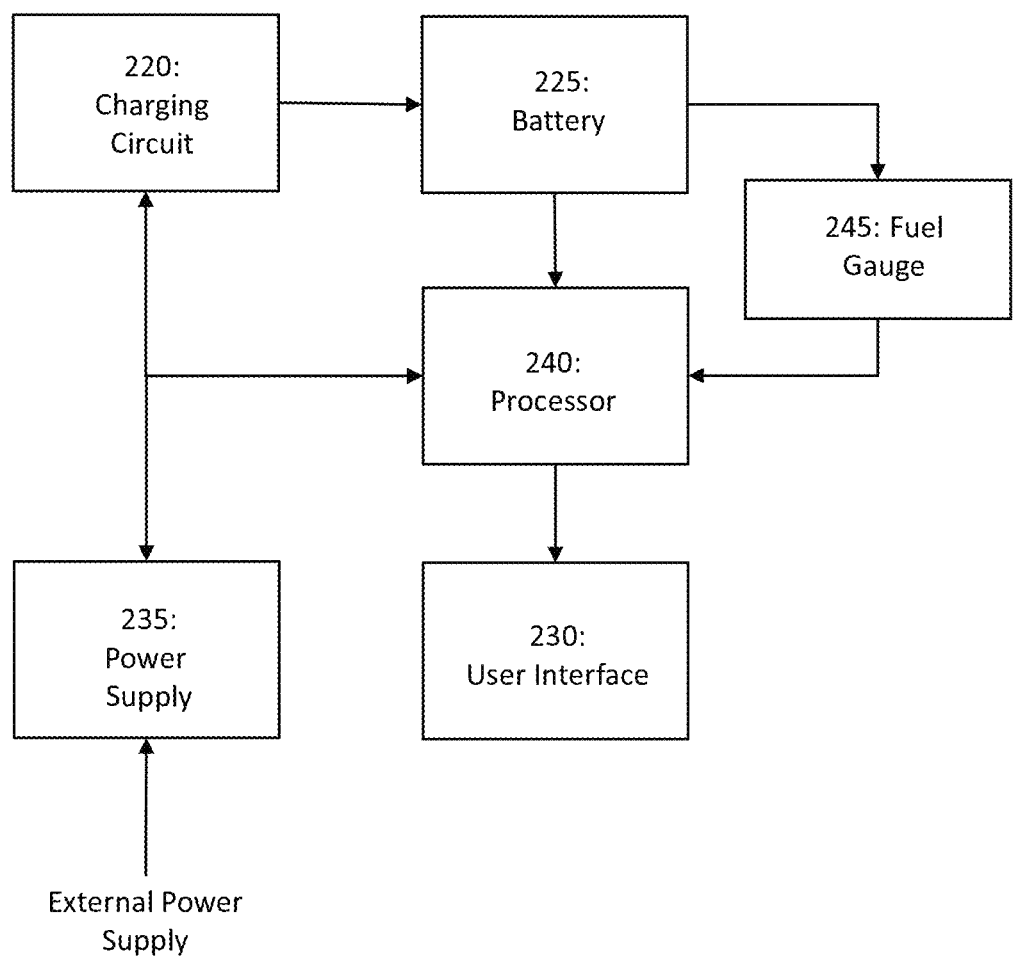
FIG. 2 shows a system 200 for detection of an improper power supply detection in an electronic device according to an exemplary embodiment of the present disclosure.

Turning now to FIG. 2, a system 200 for detection of an improper power supply in an electronic device according to an exemplary embodiment of the present disclosure is shown. The system 200 may include a charging circuit 220, a battery 225, a power supply 235, a processor 240, and a user interface 230. The power supply 235 is operative to power the processor 240, the user interface 230, and the charging circuitry 220 in response to a voltage received from the battery 235 or from an external power supply, such as an external 5-volt power supply. The power supply 235 may be operative to generate an appropriate voltage to couple to the processor 240 in order to commence operation of the system 200. The power supply 235, in response to a control signal from the processor 240 and from a voltage supplied from an external power supply, is further operative to energize the charging circuit 220 in order to charge the battery 225. According to design criteria, battery charging may be performed during operation of the processor 240.

The charging circuit 220 is operative to receive a voltage from the power supply 235 and to convert this voltage to an appropriate voltage and current to recharge the battery 225. The charging circuit 220 may be operative to monitor the output current and/or voltage of the battery 225 in order to determine if the battery 235 should be recharged. For example, a battery output of 4.3 volts may be considered fully charged and the charging circuit 220, in response to detecting a battery output of 4.3 volts may stop a recharging voltage application. Upon detecting a subsequent battery output of a predetermined charging voltage, for example of 3.7 volts, the charging circuit 220 may again continue the recharging voltage application until the battery 225 is recharged to the fully charged level. In this exemplary embodiment, the charging circuit 220 may further be operative to detect a state of a discharge current from the battery 225, indicative of a battery supplying power to the device. The charging circuit 220 may then generate a control signal or the like to couple to the processor 240 indicative of the discharging battery state.

In an alternate embodiment, a fuel gauge device 245 may be used to detect a state of a discharge current of the battery 225. The fuel gauge device 245 may be implemented as a discrete device, a circuit, an integrated circuit, or as a component of the charging circuit 220. In an exemplary embodiment, an average current register within the fuel gauge device 245 may be used to detect the battery discharge current. The average current register may return a signed integer value that is the average current flow through a current sense resistor. The signed digit is used to detect the battery current discharging or not discharging. In a particular example, the fuel gauge device 245 may be operative to generate an I$^2$C error for coupling to the processor 240.

The battery 225 may be a rechargeable lithium ion battery or the like and is operative to power the processor 240 and the user interface 230 in the absence of a connection of an external power supply. In an alternative embodiment, the battery 225 may be operative to power the processor 240 and the user interface 230 when the external power supply is connected and the charging circuit 220 is operative to apply a recharging voltage to the battery 225. The battery 225 may be further operative to monitor the charge level of the battery 225 and to discontinue coupling voltage to other components in the system 200 in response to the charge level falling below a cutoff voltage. This decoupling of the output voltage is performed in order to prevent a further discharge of the battery 225 resulting in damage to the battery 225 or other components in the system 200.

The processor 240 is operative to receive data from at least one of the power supply 235, charging circuit 220, battery 225, and fuel gauge 245 indicative of a battery current. The processor 240 is then operative to determine if the average battery current is negative, indicating that the battery 225 is discharging. If the battery is discharging over a duration of time, such as three seconds, the processor 240 may then generate an improper power supply error indicator and couple this improper power supply error indicator to the user interface for display to a user.

The processor 240 may be further operative to determine if the battery current changes polarity a number of times over a time duration, such as five changes in polarity over a three second time duration. If the battery current rapidly changes polarity, this may be indicative of a faulty or intermittent external power supply or external power supply cable. In response to the rapid change in polarity of the batter current, the processor 240 is then operative to generate a faulty power supply error indicator and to couple this faulty power supply error indicator to the user interface for display to a user.

The user interface 230 may be a series of LED lights, a display screen, an audio output or the like. The user interface 230 is operative to receive a user prompt from the processor 240 and generates an indication in response to the user prompt. For example, in the instance where the user prompt is indicative of a power supply fault, the user interface 230 is operative to generate an indication indicative of the power supply fault. In addition, in the instance where the user prompt is indicative of a faulty USB cable, the user interface 230 is operative to generate an indication indicative of the USB cable fault. These indications may be illumination of an LED or a pattern of LEDs, may be generation of an audible beep, pattern of beeps, or another audible alarm. The indication may be a code, icon, or message on a display screen.

Figure 3:
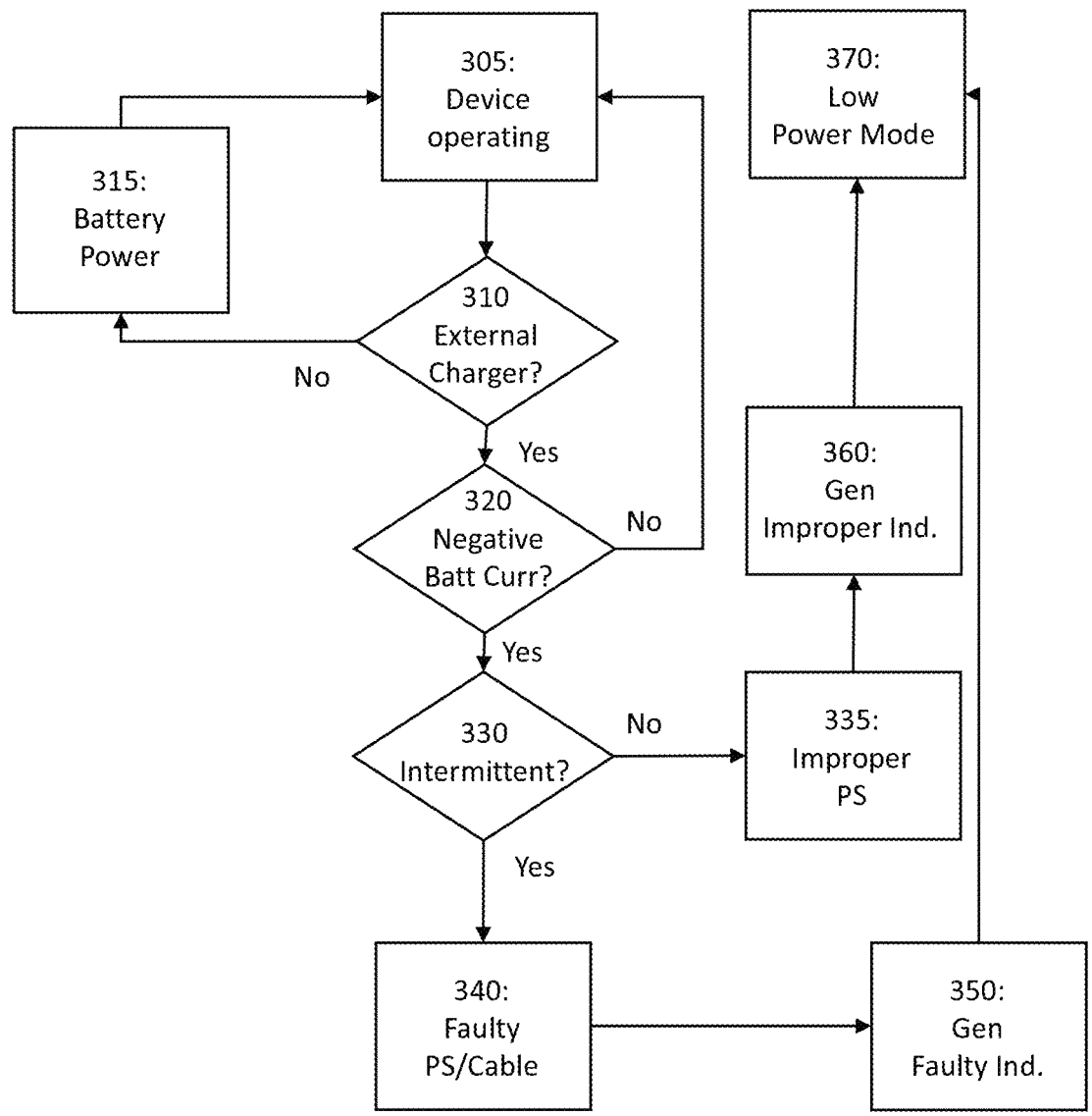
FIG. 3 shows a method 300 for detection of an improper power supply detection in an electronic device according to an exemplary embodiment of the present disclosure.

Turning now to FIG. 3, a method 300 for detection of an improper external power supply is shown. The method is first operative to initiate and begin to operate 305 the device in a standard operating mode. This may include receiving, processing, converting and transmitting data or the like. The method is next operative to determine 310 if an external charger is connected to the device. The presence of an external charge may be determined in response to an internal power supply input voltage, a battery charger state, or the like. In an exemplary embodiment, the device internal power supply may sense an input voltage of 5 volts and generate an indicator of the input voltage and couple this indicator to a processor. If an external charger is not connected, the method is then operative to operate 315 the device using battery power and the method continues to operate the device 305 while that battery has sufficient charge above the cutoff voltage.

The method is next operative to determine a battery current level for an integrated rechargeable battery within the device. The battery current level may be determined in response to a battery fuel gauge indicator, such as a current level register or an average current register. Alternatively, the battery current level may be determined in response to a voltage from a battery charging circuit indicative of a battery being charged, indicating a positive current to the battery, or indicative of a negative current to the battery, indicative of a discharging battery.

The method is next operative to determine 320 if the battery current is negative. If the battery current is not negative, is may be assumed that the external power supply is sufficient to power to the device and the method returns to operating 305 the device. If the battery current is negative, the rechargeable battery is discharging and it may be assumed that the power supply is an improper power supply which is not supply a sufficient power to the device. If the battery current is negative, the method is next operative to determine 330 if the negative battery current is intermittent. The method is operative to receive a number of battery current levels periodically over a duration of time, such as every 50 milliseconds over a three second duration. If the average battery current remains negative and/or if there are not a number of polarity changes during the time duration, the method may determine 335 that the battery is constantly discharging and that the power supply is an improper power supply and is not supply sufficient power to the device.

If an improper power supply is determined, the method is next operative to generate 360 an error indicator indicative of the improper power supply. The error indicator may be transmitted or coupled to a user interface for display to a device user. The user interface may be an LED, a warning provided on a display screen or the like. In one exemplary embodiment, the method may then be operative to commence operating 370 in a low power mode, such as a standby mode or the like. The error indicator may continue to be presented to a device user during the low power mode. In another exemplary embodiment, the low power mode may be an off mode with only the improper power supply error indicator active.

If the battery current is intermittent 330, for example, the battery current changes polarity number of times over the time duration, the method may determine 340 that one of the external power supply and/or the cable is faulty. For example, the rapid changes in polarity of the battery current may indicate that a cable connecting the external power supply has been damaged and is only making intermittent electrical contact. In an exemplary embodiment, if the battery current changes from a positive current, indicating a charging of the battery, to a negative current, indicating that the battery is powering the device, a significant number of times during a short time duration, it may indicate that the cable is intermittently making contact between the external power supply and the device and therefore is faulty or damaged. Alternatively, the intermittent power supply and/or cable may be determined but by monitoring a $V_{BUS}$ power detection interrupt to a general-purpose input/output (GPIO) of the processor. For example, if the $V_{BUS}$ is interrupted a number of times over the time duration, the method may determine 340 that one of the external power supply and/or the cable is faulty.

In response to the determination of the faulty external power supply or cable, the method is next operative to generate 350 an error indicator indicative of a faulty power supply and/or cable and couple this error indicator to the user interface for display to a user. In one exemplary embodiment, the faulty power supply error indicator may be the same as the improper power supply indicator. In another exemplary embodiment, the improper power supply and faulty power supply error indicators are separate indicators allowing the user to distinguish between a faulty power supply and an underpowered power supply.

Figure 4:
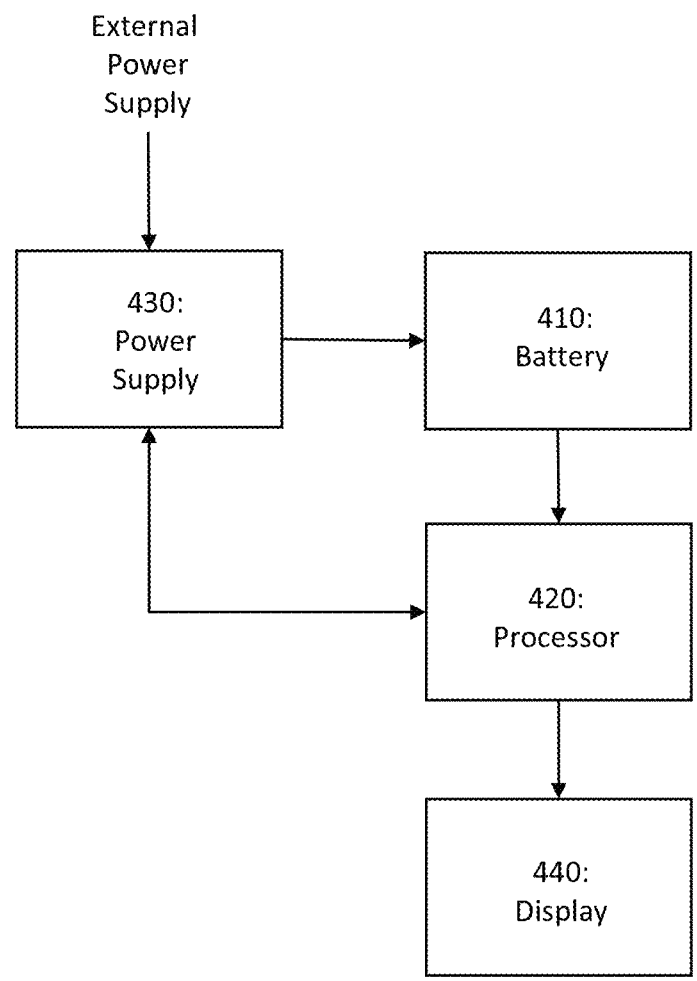
FIG. 4 shows another system 400 for detection of an improper power supply detection in an electronic device according to another exemplary embodiment of the present disclosure.

Turning now to FIG. 4, another system 400 for detection of an improper external power supply according to an exemplary embodiment of the present disclosure is shown. In this exemplary embodiment, the system 400 is a battery-operated device which may include a battery 410, a power supply 430, a processor 420, and a display 440.

In this exemplary embodiment, the battery 410 may be a rechargeable battery having a battery current output. The battery current output may have a negative current polarity indicative of a discharging battery and a positive current polarity indicative of a charging battery. The battery 410 may be a Lithium Ion battery. The battery may further include a fuel gauge circuit for indicating battery performance metrics such as charge level and/or voltage output and wherein the fuel gauge circuit may include an average current register for indicating an average battery output current over a predetermined period of time, such as three seconds.

The system may further include a power supply circuit 430 for providing operating power to the device 400 and for charging the battery 410. The power supply circuit 430 may receive power from an external power supply and convert this external power into the appropriate voltages and currents for powering the device 400. In this exemplary embodiment, the power supply circuit 430 may be further operative for generating a control signal in response to receiving an external voltage, an external current, and/or an external power from an external power supply.

The system may further include a processor 420 operative to determine a first polarity of the battery current output of the battery 410 at a first time in response to the control signal from the power supply 430. In one exemplary embodiment, the first polarity may be a negative polarity indicative of the battery supplying a power to the battery-operated device. The processor 420 may be further operative to generate an error indicator in response to the first polarity being indicative of a discharging battery. In one exemplary embodiment, the error indicator may be generated in response to an average battery current output determined in response to the first polarity and a second polarity at a second time being indicative of a discharging battery. The processor 420 may be further operative to determine a second polarity at a second time and to generate a faulty power supply indicator in response to the first polarity being opposite of the second polarity. The processor 420 may further be operative to enter a standby mode and/or a shutdown mode in response to the first polarity of the battery current output and the control signal.

The exemplary system may further include a display 440 operative to display a user warning indicative of an improper external power supply in response to the error indicator. The display may display may further include a user interface and/or a speaker for providing an audible alert in response to the error indicator. the display being further operative to display a faulty power supply user warning in response to the faulty power supply indicator. The display 440 may further be operative to display the faulty power supply user warning and/or the improper power supply user warning when the processor 420 is in a standby or shutdown mode.

Figure 5:
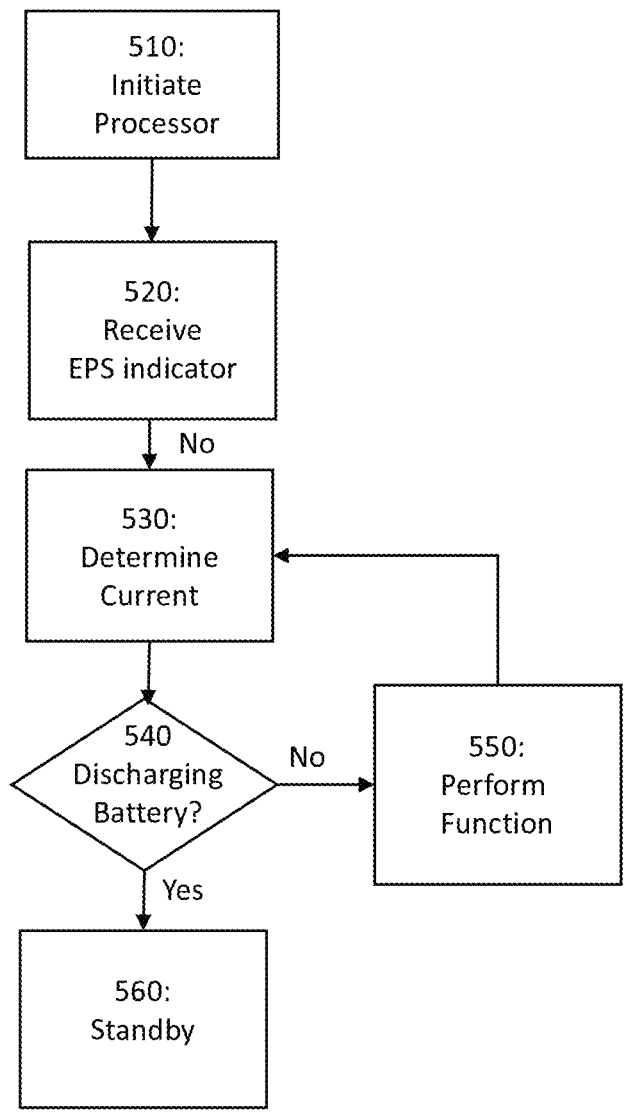
FIG. 5 shows another method 500 for detection of an improper power supply detection in an electronic device according to another exemplary embodiment of the present disclosure.

Turning now to FIG. 5, another method 500 for detection of an improper external power supply according to an exemplary embodiment of the present disclosure is shown. The method is first operative to initiate 510 a processor operative to perform a function within a battery-operated device. In this exemplary embodiment, the function is conversion of a received video signal to a format suitable for transmission of the video signal on a wireless network.

The exemplary method is next operative for receiving 520 an indication of a connection of an external power supply. The indication may be generated by a charging circuit within the device or a power supply circuit within the device. The indication of a connection of an external power supply may be determined by detecting a voltage and/or current at an external power supply input or at a point within a power supply circuit not powered by a battery. The external power supply may be a universal serial bus charger and cable supply a five-volt voltage to the device.

In this exemplary embodiment, the method may be next operative for determining 530 a first output current of a battery. In an exemplary embodiment, the first output current of the battery may have a negative value indicative of the discharging battery. In one exemplary embodiment, the current output of the battery may be provided by an average current register or current register in a fuel gauge circuit connected to the battery. In another exemplary embodiment, the current output maybe determined by detecting a voltage within a battery charging circuit or the like. The detection of the output voltage in one example may include determining a polarity of the output current and/or an average polarity of the output current over a duration of time.

The exemplary method is next operative for generating 540 an error indicator in response to the first output current of the battery being indicative of a discharging battery. The error indicator may be further generated in response to the detection of the connection of the external power supply and wherein the discharging of the battery is indicative of insufficient power being supplied by the external power supply to power the device. In addition, if the average output current of the battery is near zero amps, the method may be further operative to determine a number or output current polarity changes over a duration of time, such as three seconds. If the number of current polarity changes exceeds a threshold amount, such as five changes over the duration of time, the method may be operative to generate the error indicator.

The method is next operative for displaying 550 a user prompt indicative of an improper power supply in response to the error indicator. In an exemplary embodiment, the user improper power supply may be detected in response to the external power supply being operative to provide an insufficient power level to the battery-operated device. In one exemplary embodiment the user prompt is displayed via a light emitting diode.

In another exemplary embodiment, the method may further be operative to determine a second output current of the battery and wherein the second output current is indicative of a charging battery, generating a faulty power supply indicator in response to the first output current and the second output current, and displaying a faulty power supply warning in response to the faulty power supply indicator. In additional embodiment, the method may be operative perform a standby function within the battery-operated device in response to the error indicator or shutting down the battery-operated device in response to the error indicator.

The term "exemplary" is used herein to represent one example, instance or illustration that may have any number of alternates. Any implementation described herein as "exemplary" should not necessarily be construed as preferred or advantageous over other implementations. While several exemplary embodiments have been presented in the foregoing detailed description, it should be appreciated that a vast number of alternate but equivalent variations exist, and the examples presented herein are not intended to limit the scope, applicability, or configuration of the disclosure in any way. To the contrary, various changes may be made in the function and arrangement of the various features described herein without departing from the scope of the claims and their legal equivalents.

The invention claimed is:

1. A method comprising:
    initiating a processor operative to perform a function within a battery-operated device, the battery-operated device including an internal battery;
    receiving, by the processor, an indication the battery-operated device is receiving power from an external power supply;
    determining, by the processor, a first output current of the internal battery;
    generating, by the processor, an error indicating the external power supply outputs insufficient power to the battery-operated device,
    wherein the error indicates that the external power supply is improper and nonfaulty in response to the first output current of the internal battery indicating that the internal battery is consistently discharging while receiving a normal power from the external power supply in a non-faulty state,
    wherein the error indicates the external power supply is faulty in response to the first output current indicating the internal battery is intermittently discharging while receiving a power from the external power supply in a faulty state; and
    displaying a user prompt indicative of an improper or faulty power supply as indicated by the error.

2. The method of claim 1 wherein the first output current of the internal battery has a negative value.

3. The method of claim 1 wherein the external power supply outputs an insufficient power level to the battery-operated device.

4. The method of claim 1, further comprising:
    determining a second output current of the internal battery, wherein the second output current indicates the internal battery is charging;
    generating a faulty power supply indicator in response to the first output current and the second output current; and
    displaying a faulty power supply warning in response to the faulty power supply indicator.

5. The method of claim 1 wherein the processor performs a standby function within the battery-operated device in response to the error.

6. The method of claim 1 wherein the user prompt is displayed via a light emitting diode.

7. The method of claim 1 wherein the internal battery is a lithium ion battery.

8. The method of claim 1 further including shutting down the battery-operated device in response to the error.

9. A battery-operated device comprising:
    an internal battery having a battery current output;
    an internal power supply for receiving an external voltage and an external current from an external power supply and for generating a control signal in response to receiving the external voltage, the internal power supply in electronic communication with the internal battery;

a processor in electronic communication with the internal battery, operative to determine a first polarity of the battery current output at a first time in response to the control signal, and operative to generate an error indicating the external power supply outputs insufficient power to the battery-operated device, wherein the error indicates the external power supply is improper and nonfaulty in response to the first polarity indicating the internal battery is consistently discharging while receiving the external voltage from the external power supply, wherein the error indicates the external power supply is faulty in response to the first polarity indicating the internal battery is intermittently discharging while receiving the external voltage from the external power supply; and a display operative to display a user warning indicative of an improper or faulty external power supply as indicated by the error.

10. The battery-operated device of claim 9 wherein the error is generated in response to an average battery current output determined in response to the first polarity and a second polarity at a second time indicating the internal battery is discharging.

11. The battery-operated device of claim 9 further including a user interface for providing an audible alert in response to the error.

12. The battery-operated device of claim 9 wherein the internal battery is a lithium ion battery.

13. The battery-operated device of claim 9 wherein the user warning is a signal for illuminating a light emitting diode.

14. The battery-operated device of claim 9 wherein the processor is further operative to determine a second polarity at a second time and to generate a faulty power supply indicator in response to the first polarity being opposite of the second polarity, the display being further operative to display a faulty power supply user warning in response to the faulty power supply indicator.

15. The battery-operated device of claim 9 wherein the first polarity is a negative polarity indicative of the internal battery supplying a power to the battery-operated device.

16. The battery-operated device of claim 9 wherein the processor is further operative to enter a standby mode in response to the first polarity of the battery current output and the control signal.

17. The battery-operated device of claim 9 wherein the processor is further operative to enter a shutdown mode in response to the first polarity of the battery current output and the control signal.

18. The battery-operated device of claim 9 wherein the first polarity is determined in response to an average current register or a battery fuel gauge device.

19. An apparatus for detecting an improper external power supply coupled to a rechargeable battery equipped device, the apparatus comprising:

a sensor operative to detect a connection of an external power supply and to generate a control signal in response to detecting the connection of the external power supply;

an internal battery having a battery output current;

a battery charging circuit operative for charging the internal battery in response to a power received from the external power supply;

a processor powered by the internal battery and configured to receive the control signal, to detect a current polarity of the internal battery in response to the control signal, and to generate an error signal indicating the external power supply outputs insufficient power to the battery charging circuit, wherein the error signal indicates the external power supply is improper and nonfaulty in response to the current polarity indicating the internal battery is consistently discharging while receiving the power from the external power supply, wherein the error signal indicates the external power supply is faulty in response to the current polarity indicating the internal battery is intermittently discharging while receiving the power from the external power supply; and a user interface for displaying an improper power supply warning in response to the error signal.

20. The apparatus of claim 19 wherein the processor is further operative to engage a standby mode for the rechargeable battery equipped device in response to the current polarity being negative indicative of a discharging battery.

* * * * *